United States Patent
Murase et al.

(10) Patent No.: US 7,952,440 B2
(45) Date of Patent: May 31, 2011

(54) CRYSTAL DEVICE FOR SURFACE MOUNTING

(75) Inventors: Shigeyoshi Murase, Saitama (JP); Chisato Ishimaru, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 106 days.

(21) Appl. No.: 12/384,960

(22) Filed: Apr. 10, 2009

(65) Prior Publication Data

US 2009/0261915 A1    Oct. 22, 2009

(30) Foreign Application Priority Data

Apr. 18, 2008   (JP) ................................ 2008-108457
Feb. 6, 2009    (JP) ................................ 2009-026080

(51) Int. Cl.
*H03B 1/00*     (2006.01)
*H03B 5/32*     (2006.01)
*H01L 41/053*   (2006.01)

(52) U.S. Cl. ........ 331/68; 331/108 D; 331/158; 310/348

(58) Field of Classification Search .................... 331/67, 331/68, 108 C, 108 D, 116 FE, 116 R, 154, 331/158; 310/311, 348, 349, 351, 365–368

See application file for complete search history.

(56) References Cited

U.S. PATENT DOCUMENTS 6,778,029 B2 *   8/2004   Mizusawa ........................ 331/68
6,998,925 B2 *   2/2006   Harima et al. .................. 331/68

FOREIGN PATENT DOCUMENTS

JP    2007-075857    3/2007
JP    2007-173976    7/2007

* cited by examiner

*Primary Examiner* — Levi Gannon
(74) *Attorney, Agent, or Firm* — Carrier Blackman & Associates, P.C.; Joseph P. Carrier; William D. Blackman

(57) ABSTRACT

A crystal device has an area defined inside a ceramic case thereof, and this area is made larger to increase the design freedom for mounting of a crystal unit (crystal element) in the crystal device. The crystal device is configured such that at least one crystal element is housed in a ceramic case in a rectangular form as seen in plan view. The crystal device includes the ceramic case having a bottom wall and a frame wall, and whose cross section is formed to be concave, and a metal cover jointed to a metal ring provided at an end face of the opening of the ceramic case by seam welding, to hermetically encapsulate the crystal element therein. The crystal device is configures such that one of the widths of the long side and the short side of the metal ring is shorter than the other one.

8 Claims, 3 Drawing Sheets

{Fig. 1}

BACKGROUND ART

CRYSTAL DEVICE FOR SURFACE MOUNTING

TECHNICAL FIELD

The invention relates to a technical field of a crystal device for surface mounting which is appropriate for miniaturization, and in particular, to a crystal device hermetically encapsulating a crystal element therein by seam welding.

BACKGROUND ART

A crystal device for surface mounting such as a crystal unit, a crystal oscillator, or a crystal filter is known as a frequency control element. For example, a crystal unit for surface mounting (hereinafter, referred to as a surface-mounted unit) is integrated into an oscillator circuit, to be built into various types of electronics as a source of frequency or as a time reference. In recent years, the miniaturization thereof has been further advanced, which has brought about their planar outlines which are 2.0×1.6 mm or less, for example.

FIG. 3 are diagrams for explanation of a related art surface-mounted unit, in which FIG. 3(a) is a cross-sectional view of the related art surface-mounted unit, and FIG. 3(b) is a plan view of the related art surface-mounted unit without a metal cover.

The related art surface-mounted unit is configured such that a crystal element 2 is housed in a ceramic case 1 in a rectangular form in plan view, whose cross section is formed to be concave. A metal cover 3 is jointed to an end face of the opening of the ceramic case 1 by seam welding, to hermetically encapsulate the crystal element 2. The ceramic case 1 is composed of a bottom wall 1a and a frame wall 1b, and a metal ring 4 is fixed to the upper surface of the frame wall 1b serving as an end face of the opening by, for example, silver solder (not shown).

In this case, the outline of the metal ring 4 is made smaller than the outline of the ceramic case 1, to prevent the metal ring 4 from protruding from the end face of the opening of the ceramic case 1. That is, the metal ring 4 is formed to have outside dimensions for estimated clearances (error tolerance) Then, the inner circumference of the metal ring 4 is made to basically correspond to the inner circumference of the frame wall 1b of the ceramic case 1, and the widths of the long side and the short side of the metal ring 4 are made identical to one another.

Then, external terminals 5 are provided to the four corners of the outer bottom face of the ceramic case 1 (bottom wall 1a) and crystal holding terminals 6 are provided to the both sides of one end of the inner bottom face. A pair of the external terminals 5 obliquely facing each other in the four corners of the outer bottom face is electrically connected to the crystal holding terminals 6 on the inner bottom face through a lamination plane and unillustrated through holes (electrode through holes). The other pair of the external terminals 5 obliquely facing each other is electrically connected to the metal ring 4 through electrode through holes and the like.

The crystal element 2 is formed as an AT-cut crystal element, and is formed into a rectangular form, which is long, for example, in a direction of the X axis among crystal axes (XY'Z'), and a thickness of the crystal element 2 is the Y' axis and a width of the crystal element 2 is the Z' axis. The AT-cut crystal element oscillates in a thickness-shear oscillation mode, and the direction of the X axis is a displacing direction of the thickness-shear oscillation. The crystal element 2 has excitation electrodes 7 on its both principal surfaces, and leading electrodes 8 are extended on the both sides of one end serving as outer circumferential portion thereof. The extended both sides of the one end of the crystal element from which the leading electrodes 8 are extended, are fixed to the crystal holding terminals 6 by an electrically conductive adhesive 10. Thereby, the extended both sides of the one end of the leading electrodes 8 are electrically and mechanically connected to the crystal holding terminals 6. The metal cover 3 is formed into a planar outline which is smaller than the planar outline of the metal ring 4 for estimated clearances as described above.

Seam welding energizes between the pair of roller electrodes while making a pair of roller electrodes (not shown) contact the one end side of a set of sides facing each other of the metal cover 3 to press those to rotate so as to travel to the other end side. Thereby, an Ni (nickel) film on the outer circumferential surface of the metal cover 3 is fused by Joule heat so as to be jointed to the metal ring 4. Then, after the set of the sides facing each other of the metal cover 3 are jointed to the metal ring 4 the other set of sides facing each other are jointed thereto in the same way.

In these cases, the facing surface of the metal cover 3 with respect to the metal ring 4 is basically jointed to the metal ring 4, and a width of the joint surface (facing surface) of the metal cover 3 with respect to a width of the metal ring 4 is a so-called sealing path. In this case, if a welding current serving as one of the welding conditions is made too low, unjointed portions are generated to deteriorate its airtightness. In contrast thereto, if a welding current is made too high, splashes are caused to make metal dust splash inside the ceramic case to adhere to the crystal element 2 for example, which deteriorates its oscillation property.

For this reason, welding conditions such as a welding current including a rotational speed of electrode rollers are strictly limited. However, in reality, if welding conditions, for example, a welding current is strictly limited within a narrow range, a welding current varies depending on a power fluctuation or the like, which cause the occurrence of airtight loss or splashes. Then, normally, a width of the metal ring 4 is broadened to broaden a width of the facing surface of the metal cover 3. Thereby, not only is airtightness ensured and the occurrence of splashes suppressed, but also welding conditions are relaxed by raising especially an upper limit of a welding current to ensure its airtightness and to improve its productivity.

{Citation List}
{Patent Literature}
   {PTL 1} JP-A-2007-173976
   {PTL 2} JP-A-2007-75857

SUMMARY OF INVENTION

{Technical Problem}
However, the related art surface-mounted unit described above has the problem that the smaller the planar outline of the surface-mounted unit is made, the smaller the plate surface area of the crystal element 2 is made, which deteriorates its design freedom. That is, when the plate surface area of the crystal element 2 is made smaller, negative effects, for example, crystal impedance (hereinafter, called CI) is increased, it is difficult to suppress spurious, a capacitor ratio (C0/C1) is increased to reduce a variable frequency range, and the like are brought about. Accordingly, its design freedom is deteriorated.

For this reason, for example, a width of the frame wall of the ceramic case 1 (frame wall 1b) maybe narrowed to increase an area of the inner bottom face. However, in this case, the frame width of the metal ring 4 as well in seam welding described above is decreased (narrowed), and its sealing paths as well are shortened. Accordingly, there has been the problem that welding conditions for ensuring its airtightness and suppressing splashes are strictly limited, to reduce its productivity.

An object of the invention is to provide a crystal device by seam welding in which an area inside a ceramic case is made larger to increase the design freedom of a crystal unit (crystal element), and its productivity is retained.

{Solution to Problem}

According to a first aspect of the invention, there is provided a crystal device for surface mounting comprising: a ceramic case, which has a rectangular shape in a plan view, which cross section is formed to be concave by a bottom wall and a frame wall, and which houses at least a crystal element; a metal ring, which has an annular shape, and which is provided at an end face of an opening of the ceramic case; and a metal cover, which planar outline is made smaller than that of the metal ring, wherein the crystal device for surface mounting is configured such that: an outer circumferential surface of the metal cover is spaced from the outer circumference of the metal ring so as to face a surface of the metal ring to be seam-welded to the surface of the metal ring, to hermetically encapsulate the crystal element; one of the widths of a long side and a short side of the metal ring is made narrower than the other one; one of the widths of a long side and a short side of the frame wall is made narrower than the other one; and one of the widths of a long side and a short side of the metal cover facing the surface of the metal ring is made narrower than the other one.

{Advantageous Effects of Invention}

According to the first aspect of the invention, since one of the long side and the short side of the metal ring for seam welding is made narrower (shorter) than the other one, a width of the frame wall of the ceramic case (frame wall) on which the other metal ring is provided can be made smaller. Accordingly, an area inside the ceramic case is made larger to house a crystal element large in outline dimensions, to increase the design freedom of a crystal unit (crystal element).

In this case, merely, one of the widths of the long side and the short side of the metal ring is made shorter, and one of the widths of the metal cover facing the surface of the metal ring is made narrower. Accordingly, provided that welding conditions for the one of the widths of the long side and the short side that has been shortened, in particular, an upper limit of a welding current is strictly limited, it is possible to prevent splashes from occurring. Thereby, welding conditions for the other one of the long side and the short side that is greater in width can be relaxed to retain its productivity.

According to the second aspect of the invention, in the crystal device for surface mounting, wherein: the width of the short side is made narrower than the width of the long side of the metal ring; the width of the short side is made narrower than the width of the long side of the frame wall; and the width of the short side is made narrower than the width of the long side of the metal cover facing the surface of the metal ring. In accordance therewith, since the frame width of the short side is made smaller than the frame width of the long side of the metal ring, a change in the short side in welding due to welding conditions is made less by the shorter distance than that in the long side. Accordingly, it is possible to relax an allowable range for electric current.

BRIEF DESCRIPTION OF DRAWINGS

{FIG. 3} Diagrams for explanation of a related art surface-mounted unit, in which

DESCRIPTION OF EMBODIMENTS

Figure 1:
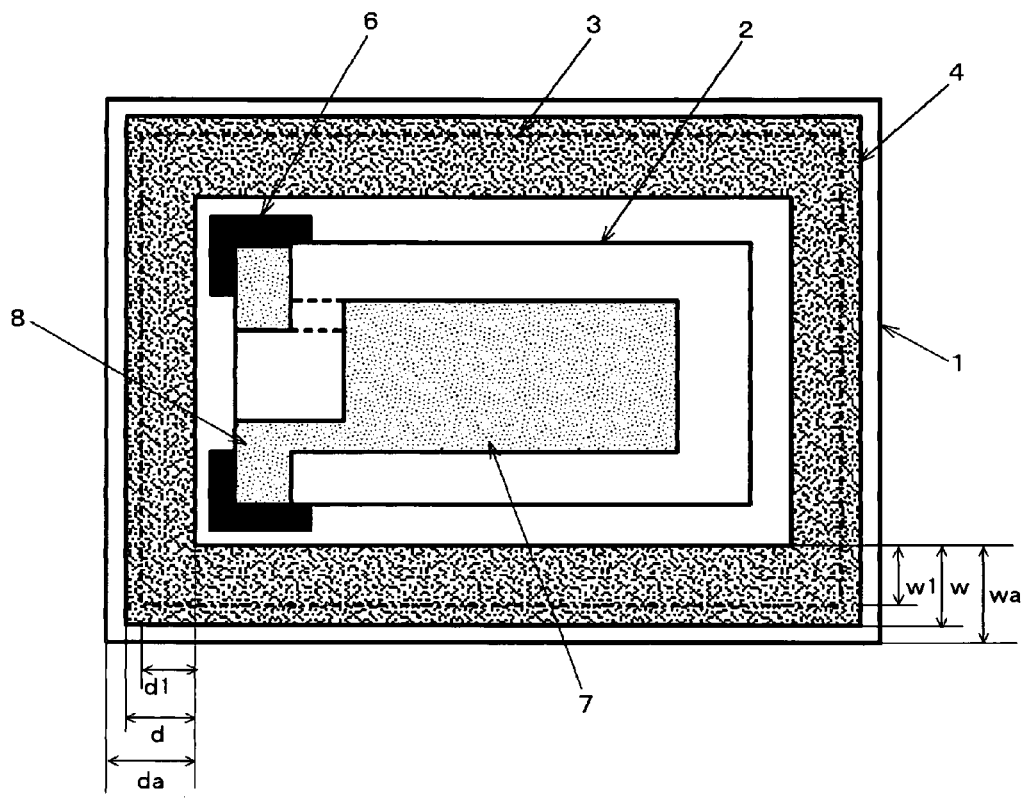
{FIG. 1} A plan view for explanation of a surface-mounted unit according to one embodiment of the invention without a metal cover.

FIG. 1 is a plan view for explanation of a surface-mounted unit according to one embodiment of the invention. Incidentally, portions which are the same as those in the related art are denoted by the same symbols, and descriptions thereof will be simplified or omitted.

The surface-mounted unit is configured, as described above, such that the crystal element 2 formed as an AT-cut crystal element, which is long in a direction of the X axis is housed in the ceramic case 1 in a rectangular form in plan view, which is composed of the bottom wall 1a and the frame wall 1b (FIG. 2), and whose cross section is formed to be concave. The ceramic case also includes an inner wall shoulder (intermediate wall) 1c disposed between the bottom wall 1a and the frame wall 1b. Then, the metal cover 3 is jointed to the metal ring 4 provided at an end face of the opening of the ceramic case 1 by seam welding, to hermetically encapsulate the crystal element 2. The metal ring 4 is fixed to the end face of the opening of the ceramic case 1 (the upper surface of the frame wall 1b) by, for example, silver solder (refer to FIG. 3).

In this case, where the planar outline of the ceramic case 1 serving as a surface-mounted unit is 2.0×1.6 mm, the metal cover 3 is 1.81×1.41 mm. Then, a frame width w of the long side of the metal ring 4 is 0.175 mm, and a frame width d of the short side is 0.165 mm, and the frame width d of the short side is made shorter than the frame width w of the long side. Thereby, a width of the frame wall wa of the long side of the ceramic case 1 is made to be 0.245 mm, and a width of the frame wall da of the short side is made to be 0.235 mm, and the width of the frame wall da of the short side is made narrower than the width of the frame wall wa of the long side.

In this case, since the metal ring 4 and the metal cover 3 are jointed together so as to match their centers, with respect to the widths (i.e., sealing paths) of the long side and the short side of the circumferential surface of the metal cover 3 facing the metal ring 4, a sealing path w1 of the long side is 0.125 mm, and a sealing path d1 of the short side is 0.115 mm. That is, a sealing path of the short side is made shorter (narrower) than a sealing path of the long side.

In such a device, as described above, the metal cover 3 is temporarily welded to the metal ring 4 provided at the end face of the opening of the ceramic case 1. Then, electrode rollers (not shown) are made to contact the pair of short sides facing each other of the metal cover 3 to perform seam welding, for example. In this case, since the frame width d of the short side of the metal ring 3 is made smaller, for example, an electric current value (allowable value) between the pair of electrode rollers is strictly limited and managed to perform welding more than in the related art.

Next, the electrode rollers are made to contact the other pair of long sides facing each other of the metal cover 3 to perform seam welding. In this case, since a frame width w of the long side of the metal ring 4 is made identical to that in the related art, even if a range for welding current serving as a welding condition, in particular, a maximum electric current value is raised, splashes are suppressed.

Given this situation, that is, since the frame width d of the short side of the metal ring 4 is made smaller, the width of the frame wall da of the pair of short sides facing each other of the ceramic case 1 as well can be shortened. Accordingly, a dimension in the length direction inside the ceramic case 1 can be increased (an area of the inner bottom face is increased), to be capable of housing the crystal element 2 large in outside dimensions, which increases the design freedom of the crystal unit. In this case, since the direction of the X-axis serving as a direction of vibration displacement of the crystal element 2 formed as an AT-cut crystal element can be elongated, crystal impedance (CI) can be basically made less.

Then, in this embodiment, since the frame width da in the direction of the short side of the metal ring 4 is made smaller, an effect of seam welding due to a change in electric current value or the like is made less than that in a case in which the frame width da in the direction of the long side is made smaller. However, even in a case in which the frame width wa of the long side is made smaller than the frame width da of the short side, the basic advantageous effects are the same, and this is not eliminated in the invention.

In the above-described embodiment, the crystal element 2 is formed as an AT-cut crystal element, which is long in a direction of the X axis. However, for example, even if the crystal element 2 is formed as an AT-cut crystal element, which is long in a direction of the Z' axis, or is formed as a crystal element having another cut-angle, the basic advantageous effects are the same, and it is a matter of course that the invention can be applied thereto.

Figure 2:
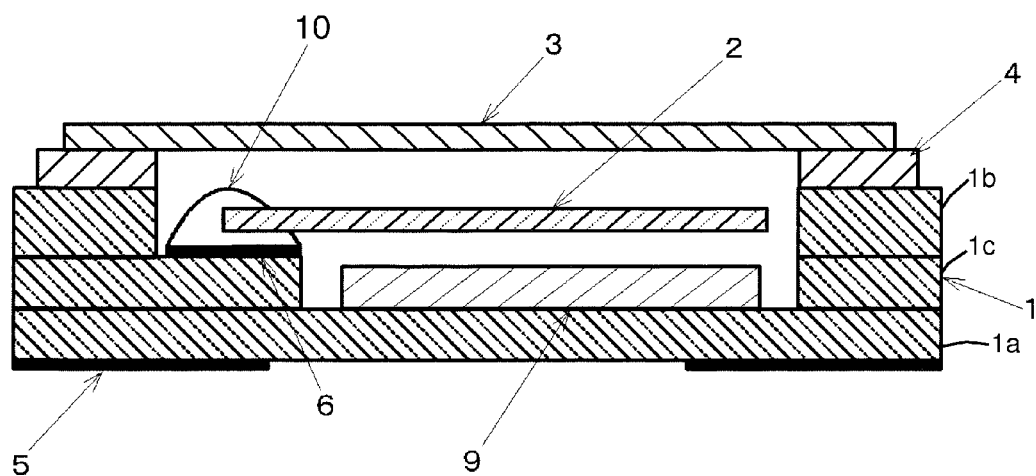
{FIG. 2} A cross-sectional view of a surface-mounted oscillator showing another example to which the invention is applied.
Figure 3A:
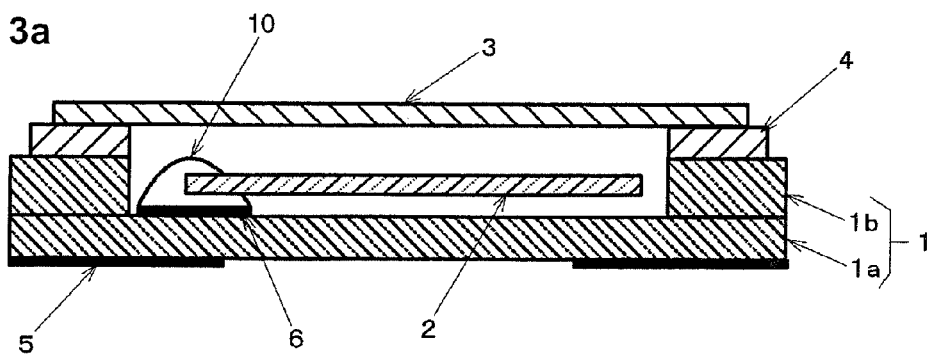
FIG. 3(a) is a cross-sectional view of the related art surface-mounted unit.
Figure 3B:
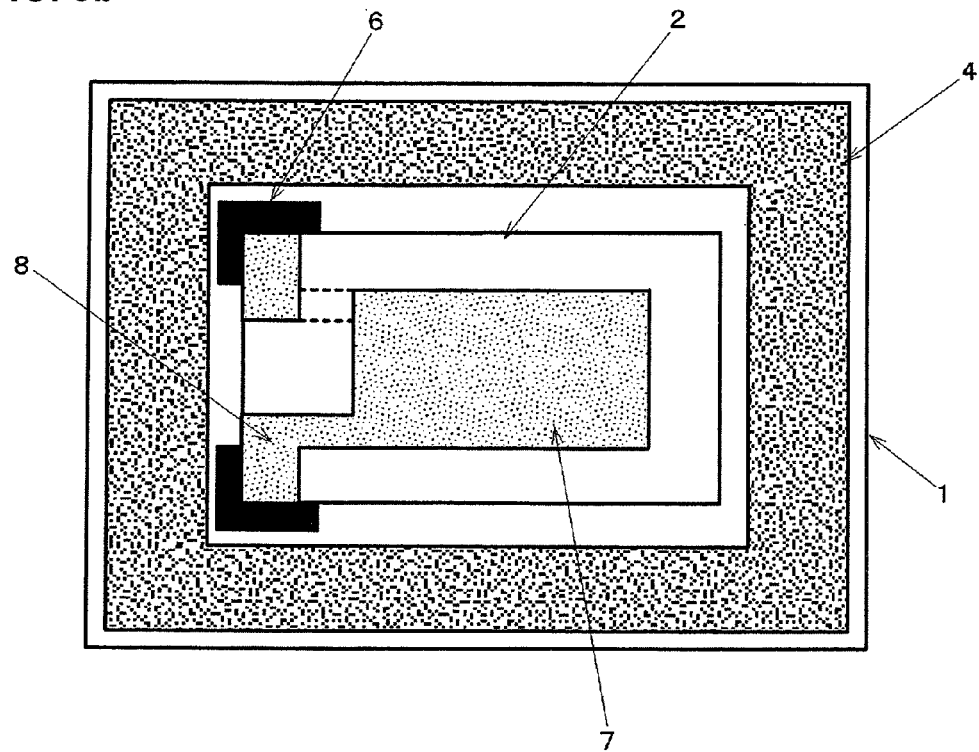
FIG. 3(b) is a plan view of the related art surface-mounted unit without a metal cover.

Further, the surface-mounted unit has been explained as an example. For example, as shown in FIG. 2, the above-described embodiment can be applied in the same way to a case in which the inner wall shoulder 1c is provided to the concave portion of the ceramic case 1, and the both ends of the one end of the crystal element 2 are fixed thereto, and an IC chip 9 is fixed to the inner bottom face of the ceramic case 1 by, for example, flip-chip bonding, to form a surface-mounted oscillator. That is, the above-described embodiment can be applied in the same way to any crystal device for surface mounting in which at least the crystal element 2 is housed.

{Reference Signs List}
1: Ceramic case
2: Crystal element
3: Metal cover
4: Metal ring
5: External terminal
6: Crystal holding terminal
7: Excitation electrode
8: Leading electrode
9: IC chip

The invention claimed is:

1. A crystal device for surface mounting comprising:
a ceramic case, which has a rectangular shape in a plan view, which cross section is formed to be concave by a bottom wall and a frame wall, and which houses at least a crystal element;
a metal ring, which has an annular shape, and which is provided at an end face of an opening of the ceramic case; and
a metal cover, which planar outline is made smaller than that of the metal ring,
wherein the crystal device for surface mounting is configured such that:
an outer circumferential surface of the metal cover is spaced from the outer circumference of the metal ring so as to face a surface of the metal ring to be seam-welded to the surface of the metal ring, to hermetically encapsulate the crystal element;
one of the widths of a long side and a short side of the metal ring is made narrower than the other one;
one of the widths of a long side and a short side of the frame wall is made narrower than the other one; and
one of the widths of a long side and a short side of the metal cover facing the surface of the metal ring is made narrower than the other one.

2. The crystal device for surface mounting according to claim 1,
wherein each of the widths of the long side and the short side of the metal ring is made shorter than the respective widths of the long side and the short side of the frame wall.

3. The crystal device for surface mounting according to claim 1, wherein:
one of the widths of the long side and the short side of the metal ring is made narrower than the other one to define a narrow side of the metal ring;
one of the widths of the long side and the short side of the frame wall is made narrower than the other one to define a narrow side of the frame wall, said narrow side of the frame wall corresponding to the narrow side of the metal ring; and
one of the widths of the long side and the short side of the metal cover facing the surface of the metal ring is made narrower than the other one to define a narrow side of the metal cover facing the surface of the metal ring, said narrow side of the metal cover facing the surface of the metal ring corresponding to the narrow side of the metal ring.

4. The crystal device for surface mounting according to claim 1, further comprising an IC chip fixed to an inner bottom face of the ceramic case.

5. The crystal device for surface mounting according to claim 1, wherein:
said ceramic case further comprises an intermediate wall disposed between said bottom wall and said frame wall thereof; and
said intermediate wall is configured to receive said crystal element thereon.

6. A crystal device for surface mounting, comprising:
a ceramic case, which has a rectangular shape in a plan view, which cross section is formed to be concave by a bottom wall and a frame wall, and which houses at least a crystal element;
a metal ring, which has an annular shape, and which is provided at an end face of an opening of the ceramic case; and
a metal cover, which planar outline is made smaller than that of the metal ring,
wherein the crystal device for surface mounting is configured such that:
an outer circumferential surface of the metal cover is spaced from the outer circumference of the metal ring so as to face a surface of the metal ring to be seam-welded to the surface of the metal ring, to hermetically encapsulate the crystal element;
one of the widths of a long side and a short side of the metal ring is made narrower than the other one;
one of the widths of a long side and a short side of the frame wall is made narrower than the other one; and
one of the widths of a long side and a short side of the metal cover facing the surface of the metal ring is made narrower than the other one; wherein:

the width of the short side is made narrower than the width of the long side of the metal ring;

the width of the short side is made narrower than the width of the long side of the frame wall; and the width of the short side is made narrower than the width of the long side of the metal cover facing the surface of the metal ring.

7. The crystal device for surface mounting according to claim 6, further comprising an IC chip fixed to an inner bottom face of the ceramic case.

8. The crystal device for surface mounting according to claim 6, wherein:

said ceramic case further comprises an intermediate wall disposed between said bottom wall and said frame wall thereof; and said intermediate wall is configured to receive said crystal element thereon.

* * * * *